United States Patent
O'Brien et al.

(10) Patent No.: US 6,281,043 B1
(45) Date of Patent: Aug. 28, 2001

(54) FABRICATION OF HYBRID SEMICONDUCTOR DEVICES

(75) Inventors: Tadhgh O'Brien, Ovens; Marie Guillot, Cloyne; Finbarr O'Donoghue, Aherla; Owen McAuliffe, Donoughmore, all of (IE)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 09/382,131

(22) Filed: Aug. 24, 1999

(51) Int. Cl.[7] .......................... H01L 21/44; H01L 21/48; H01L 21/50
(52) U.S. Cl. ........................ 438/109; 438/111; 438/112
(58) Field of Search .................................. 438/109, 111, 438/112

(56) References Cited

U.S. PATENT DOCUMENTS

| | | | |
|---|---|---|---|
| 5,484,097 | 1/1996 | Heuvel | 228/123.1 |
| 5,506,174 | * 4/1996 | Vandenheuval et al. | |
| 5,508,565 | 4/1996 | Hatakeyama et al. | 257/777 |
| 5,614,759 | 3/1997 | Vandenheuval et al. | 257/666 |
| 5,763,829 | 6/1998 | Tomita et al. | 174/52.2 |
| 5,796,162 | 8/1998 | Huang | 257/676 |

FOREIGN PATENT DOCUMENTS 0 228 869    7/1987    (EP) .................... H01L/23/48

OTHER PUBLICATIONS

Tummala, R et al., Microelectronics Packaging Handbook, Subsystem Packaging, Chapman & Hall, pp. 72–74, 1997.*

* cited by examiner

Primary Examiner—John F. Niebling
Assistant Examiner—Josetta I. Jones
(74) Attorney, Agent, or Firm—Mayer Fortkort & Williams, P.C.; Karin L. Williams

(57) ABSTRACT

Two phase bridge rectifier, plastic encapsulated devices having four external terminal leads are batch fabricated using a workpiece of three stacked together lead frames wherein, at each of a plurality of device sites on the workpiece, two, two-chip stacks of semiconductor diode chips are provided; each chip of each stack being sandwiched between respective pairs of bonding pads on either top and middle lead frames or middle and bottom lead frames. Each of the two bonding pads of the middle frame is connected to a respective integral terminal lead of the middle frame. An integral extension of a bonding pad of each of the top and bottom lead frames is bent out of the plane of its respective lead frame to include a flat terminal lead portion lying in the plane of the middle frame but not connected thereto. All four in-plane terminal leads include dam bars for use during device encapsulating; the dam bars from the top and bottom lead frames cooperating to form a single, in-plane dam bar. After encapsulation, individual devices are separated from the lead frame workpiece by severing ends of the four terminal leads from their respective lead frames.

5 Claims, 6 Drawing Sheets

FABRICATION OF HYBRID SEMICONDUCTOR DEVICES

BACKGROUND OF THE INVENTION

This invention relates to hybrid semiconductor devices, e.g., two-phase bridge rectifiers, and particularly to improvements in the apparatus and methods disclosed in U.S. Pat. No. 5,484,097, issued Jan. 16, 1996 ("the patent" hereinafter).

The patent (the subject matter of which is incorporated herein by reference) discloses a process for fabricating batches of individual devices disposed in rows and columns on a lead frame workpiece. Because all the devices are identical, details of the fabrication of but one such device are described. The patent process uses three lead frames wherein (for each device being simultaneously fabricated) two pairs of semiconductor chips are mounted on respective pairs of bonding pads of two of the lead frames. The three lead frames are then disposed one on top of the other with upper surfaces of the two chips on the bottom lead frame contacting under surfaces of the bonding pads of the overlying (middle) lead frame. The upper surfaces of the two chips on the bonding pads of the middle frame contact under surfaces of respective bonding pads of the top lead frame. The result is two stacks of two-chip stacks (for each device) with each chip being bonded between a pair of bonding pads integral with either the bottom and middle lead frames or the middle and top lead frames. Considering only the semiconductor chips in each device, eight joints (typically soldered) must be formed per device.

In the resulting bridge rectifier devices made according to the patent, each device includes four terminals, with each terminal being connected to a circuit node to which one electrode of a respective pair of chips is connected. A claimed feature in the patent is that all four device terminals lie in a common plane where they first exit a molded plastic envelope of each finished device. An advantage of this is discussed hereinafter. To achieve this feature, all four terminals comprise leads from the middle lead frame and, to this end, a respective internal electrical connection is provided between each pair of bonding pads on the top and bottom lead frames and the middle frame. This is accomplished by the provision, on the top and bottom lead frames, of respectively downwardly and upwardly bent cantilevered lead extensions from the bonding pads of the two lead frames. When the three lead frames are assembled one on top of the other, the upwardly extending lead extension from the bottom lead frame contacts the under surface of one lead terminal of the middle frame while the downwardly extending lead extension from the top lead frame contacts the upper surface of another lead terminal of the middle frame. The two lead extensions are then bonded, as by soldering, to the respective middle frame terminals. The soldering of the lead extensions to the middle lead frame terminals requires two additional joints, thus bringing to ten the total number of joints required in each device made according to the patent. The greater the number of joints in each device to be formed, the greater is the likelihood of defective devices. One improvement provided by the present invention is the elimination of two of the ten joints in each device.

In the process according to the patent, after all the ten joints are made, links joining the bonding pads of the top and bottom lead frames to their respective lead frames are severed, and the top and bottom frames are peeled off the workpiece. The remaining workpiece thus comprises only the middle lead frame, the two pairs of chips for each device secured to either upper or lower surfaces of respective pairs of bonding pads of the middle lead frame, and respectively downwardly and upwardly extending leads interconnecting the upwardly and downwardly facing bonding pads of respective pairs of chips to respective terminal leads of the middle frame.

Thereafter, the components of each device are plastic encapsulated using a known molding process with the result being that only portions of the middle lead frame extend outwardly from each molded device envelope. While not described in the patent, an important aspect of the molding process (in accordance with known practice) is that the parts to be encapsulated are disposed within a mold cavity into which a plastic molding component is injected under high pressure. Portions of the device not encapsulated extend outwardly through openings through walls of the cavity. Because of the pressure employed, which tends to force the potting compound through the smallest openings through the mold cavity walls, the preferred practice is to ensure that only single leads, in contrast to a laminate of layered leads, exit through the mold walls. If layered leads are present, it is quite difficult to prevent escape of the potting component between the layers. Additionally, even with single lead extensions from the mold cavity, a preferred practice is the use of dam bars (described further hereinafter) for limiting escape of the potting compound through the mold wall openings. The lead frame interconnecting arrangement disclosed in the patent, resulting in portions only of the middle frame exiting the mold cavity, is particularly compatible with known molding processes.

An attendant requirement in the patent, for performance of the above-described single frame encapsulation process, is that two of the lead frames be separated from the workpiece prior to encapsulation. This is accomplished, as described, by severing the links joining the bonding pads of the top and bottom lead frames to their respective lead frames after the chips are bonded in place. Such link severing, however, presents several problems. One is that, because the links are severed prior to device encapsulation, damage to the unencapsulated, hence unprotected chips, can occur. Other problems relate to the nature of the cutting operation (e.g., cutting through the links of the top and bottom frames while not damaging the middle frame) as well as to the fact that two separate frame cutting procedures are required; one before and one after device encapsulation.

Another improvement provided by the present invention is the elimination of the top and bottom link severing process.

SUMMARY OF THE INVENTION

Similarly as in the patent, three lead frames are used including pairs of interconnected bonding pads on each of the top and bottom lead frames. Each bonding pad pair of the top and bottom lead frames includes an integral extension bent out of the plane of its respective lead frame to provide a flat lead portion lying in the plane of the middle lead frame but not connected to the middle lead frame. Rather, the bonding pad extensions serve as links of the bonding pads to their respective lead frames and, in the completed, encapsulated devices, the flat lead portions serve as respective device terminals. Bonding pad links other than the bonding pad extensions are not used, hence no pre-encapsulation link cutting process is required. Also, because the bonding pad bent extensions are not connected to terminal lead portions of the middle frame, but serve themselves as device terminals, two of the ten solder joints required according to the patent are eliminated.

During the encapsulation process, all three lead frames are present but, at the mold cavity forming wall, only single leads, all lying in a common plane, pass through the mold wall. Additionally, the two bent extensions from the top and bottom lead frames cooperate to form, as hereinafter described, a planar dam bar.

DESCRIPTION OF THE DRAWING

The drawings are partially schematic and not necessarily to scale.

DESCRIPTION OF A PREFERRED EMBODIMENT OF THE INVENTION

As mentioned, the present invention provides improvements of the invention disclosed in the aforecited U.S. patent. Devices made according to the patent are presently being manufactured and sold and, except for the following, the various manufacturing processes disclosed in the patent can generally be used in the practice of the present invention.

The patent, at column 5, lines 36–40, describes that two of the four chips of each device being made are mounted anode side down while the other two chips are mounted cathode side down. This corresponds to FIG. 2 of the patent. In actual practice, however, all the chips are identically oriented and, in the embodiment of the invention herein illustrated, all the chips are mounted cathode side down. How the chips are interconnected to form a bridge rectifier device is described hereinafter.

Figure 1:
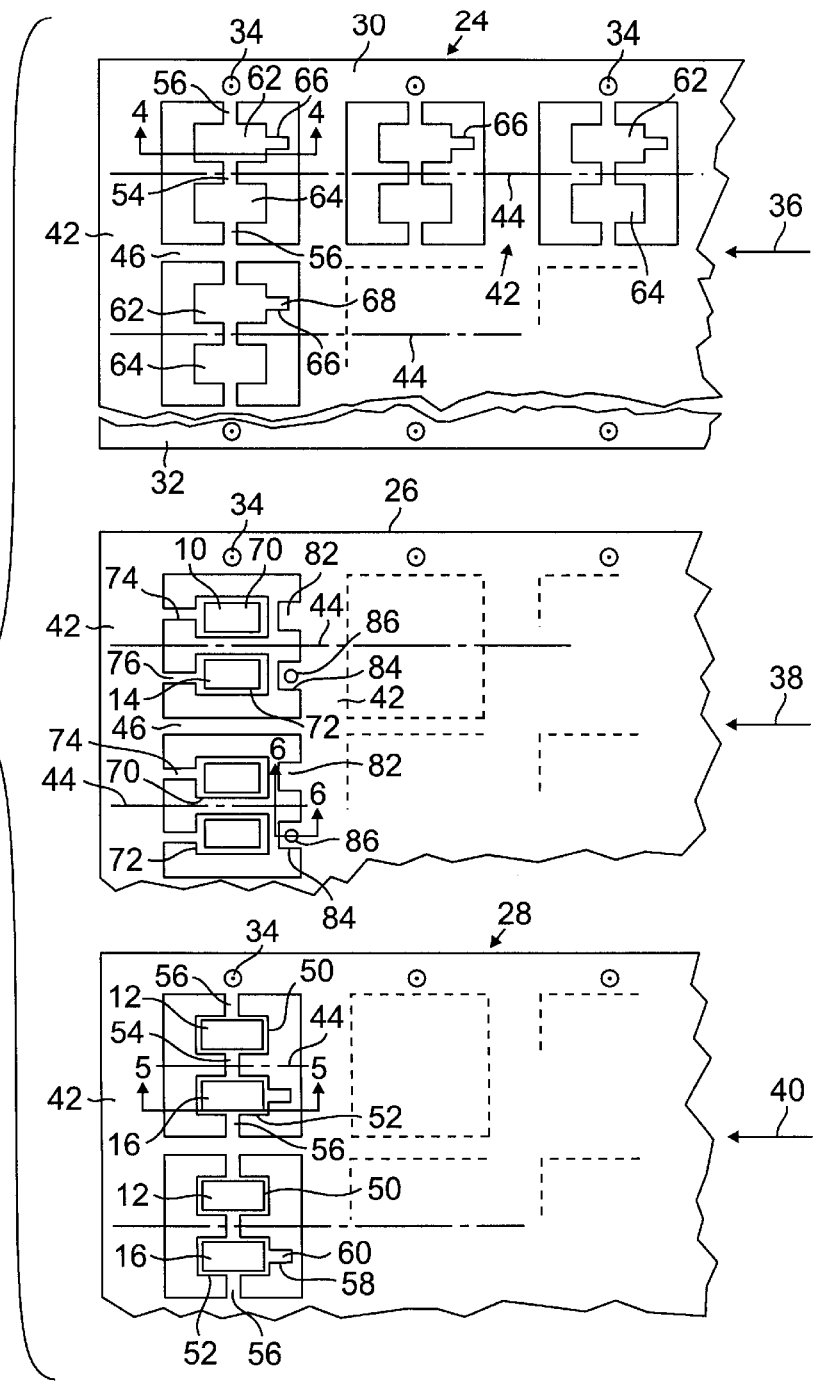
FIG. 1, copied directly from the patent, is a plan view showing, in side by side relation, the three lead frames according to the patent.

FIG. 1 shows the side by side arrangement of the three lead frames according to the patent. Each lead frame 24, 26 and 28 comprises an elongated sheet of metal, e.g., copper, having a thickness of 5 mils. When the three lead frames are assembled together one on top of the other, the lead frame 24 is the top lead frame, the lead frame 26 is the middle frame, and the lead frame 28 is the bottom frame. Batches of semiconductor devices are simultaneously fabricated on each three-frame workpiece. In FIG. 1, four separate but identical device sites are illustrated in detail on the top lead frame 24, but only two corresponding sites are illustrated in detail on lead frames 26 and 28. In a typical workpiece, each three-frame workpiece includes an array of 8 by 18 sites, and 144 devices are simultaneously fabricated on each workpiece. All the device sites are identical and, in the following, the fabrication of but one device, representative of all the devices being fabricated, is described.

The top lead frame 24 includes, at each device site, two semiconductor chip bonding pads 62 and 64 electrically and mechanically interconnected to each other by a connecting lead 54. In each device being fabricated, the only portions of the lead frame 24 present in the completed device are the connected together bonding pads 62 and 64 (and a cantilevered lead 66 hereinafter discussed). All other portions of the lead frame, including side rails 30 and 32, cross bars 42 interconnecting the side rails, and cross links 46 interconnecting the cross bars 42, are later discarded. The side rails 30 and 32 include precisely spaced apart openings 34 by means of which the lead frame 24 is advanced along a processing apparatus and by means of which the lead frame 24 is later precisely aligned with the two other lead frames 26 and 28. The two bonding pads 62 and 64 are connected to the later to be discarded ("common") portions of the lead frame 24 by links 56.

The middle frame 26 includes, at each device site, two separate chip bonding pads 70 and 72 each respectively integral with an extending lead 74 and 76 joining the pads to cross bars 42 of the lead frame. Each middle frame site also includes two terminal leads 82 and 84 hereinafter discussed.

The bottom lead frame 28, which is identical to the top lead frame 24 but flipped over, includes, at each device site, two chip bonding pads 50 and 52 integrally connected to one another by connector leads 54 and connected to later discarded portions of the lead frame 28 by links 56.

When each device made according to the patent is completed, each device includes a separate molded plastic envelope from which protrude four terminal leads all originally part of and later severed from the middle lead frame 26. Two of such four terminals are the two leads 74 and 76 of the middle frame 26 extending from the respective bonding pads 70 and 72. The other two device terminals comprise the middle frame leads 82 and 84 extending from a cross bar 42 towards, but not reaching, the respective pads 70 and 72. In each completed device, it is necessary that the connected together bonding pads 62 and 64 of the top frame 24 be connected to the terminal lead 82 of the middle frame 26, and that the bonding pads 50 and 52 of the bottom lead frame 28 be connected to the terminal lead 84 of the middle frame 26. To these ends, the top frame bonding pad 62 includes an integral, cantilevered lead 66 terminating in a portion 68 bent out of the plane of the top frame 24 and extending vertically downwardly therefrom. Similarly, the bottom frame bonding pad 52 includes an integral, cantilevered lead 58 terminating in an upwardly extending portion 60.

When the three frames are mounted one on top of the other, the frames are aligned such that the lead portion 68 dependent from the top frame 24 contacts the top surface of the middle frame terminal lead 82 while the lead portion 60 projecting upwardly from the bottom frame 28 contacts the bottom surface of the middle frame terminal lead 84. Solder, generally in the form of tacky paste, is provided on the top surfaces of the middle frame terminal leads 82 and 84 and solder joints are eventually formed between the two separate leads 82 and 84 and the respective lead portions 68 and 60 in contact therewith.

As previously noted, the solder joints to the terminal leads 82 and 84 of the middle frame 26 comprise two of ten solder joints required in the fabrication of each device in accordance with the patent. One improvement provided by the present invention, shortly to be described, is the elimination of the just mentioned two solder joints.

As previously noted, and as shown in FIG. 1, the upper frame 24 bonding pads 62 and 64 are connected to the later to be discarded portions of the frame 24 by links 56. The upper 24 and lower 28 lead frames are identical (but relatively flipped), and the lower frame bonding pads 50 and 52 are likewise connected by links 56 to the frame 28. At some point in the fabrication process, the various links 56 must be severed. According to the patent, this is done after chip soldering (after which all three frames are joined together) but before device encapsulation. This allows, as previously explained, stripping of the top and bottom frames from the workpiece thus leaving, for encapsulation, only the middle frame and the chips and the chip interconnections to the middle frame. Severing the links 56 prior to device encapsulation is somewhat of a delicate operation performed using gangs of circular saws carefully adjusted and maintained for precisely cutting the multiple links of the top and bottom lead frames while not cutting into the middle frames or damaging the immediately adjacent unencapsulated chips. While such severing process is generally successfully accomplished in factory operations, some loss of product does occur. A significant improvement provided by the present invention is the avoidance of any severing process prior to chip encapsulation.

The present invention is now described. For ease of comparison with the lead frames 24, 26 and 28 shown in the patent and reproduced herein as FIG. 1, the same reference numerals used in the patent, but followed by an "a", are used to identify parts of the inventive lead frames generally comparable to the lead frame parts shown in the patent.

Figure 2:
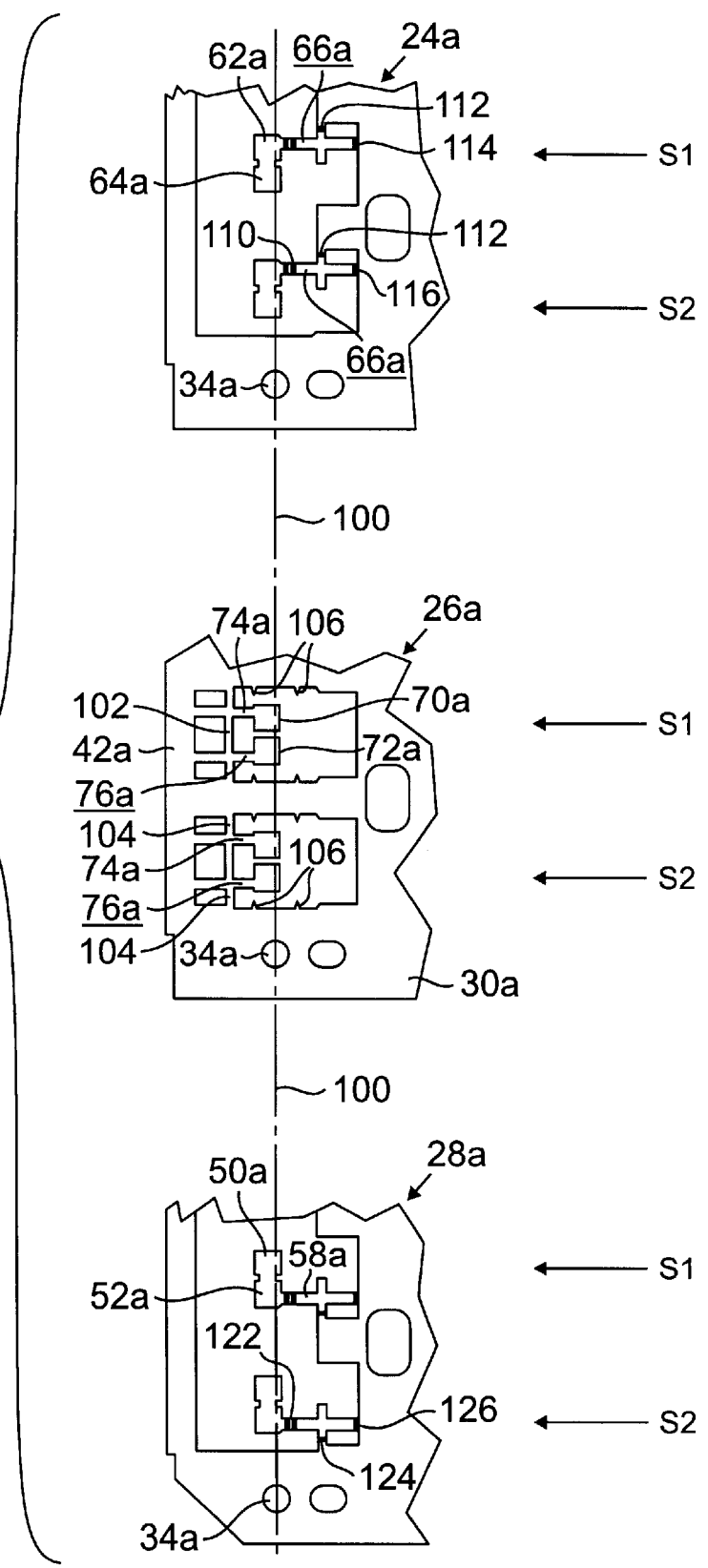
FIG. 2 is a view similar to FIG. 1 but showing three lead frames, also in side by side relation, according to the present invention.

Similarly as with the patent, three lead frames are used, as shown in FIG. 2. For simplicity of illustration, only two device sites S1 and S2 are shown on each of the three lead frames 24a, 26a and 28a shown in FIG. 2, but arrays of such sites are present similarly as shown in FIG. 1. Each lead frame is formed from a 0.010 inch thick sheet of copper measuring approximately 2$^{11}$⁄$_{16}$ by 9 inches. One hundred and forty-four device sites are present arrayed in 8 rows and 18 columns. As in the patent, alignment openings 34a are provided in each of the frames allowing for precise overlapping relationship of the three frames. When the three frames are stacked together, all the respective sites (S1, S2, . . . S144) on the three frames are precisely respectively aligned as indicated by the dashed line 100 in FIG. 2.

The device sites on the middle frame 26a each comprises two separate chip bonding pads 70a and 72a each integrally connected to a respective lead 74a and 76a connected to a cross bar 42a extending between side rails 30a (only one shown) of the lead frame 26a. The two leads 74a and 76a are interconnected by a link 102 serving, during device encapsulation (later described), as a dam bar. Additional dam bar links 104 connecting the leads 74a and 76a to later discarded portions of the lead frame 26a are also present. Also present on the middle frame 26a at each device site Sn are four prongs 106. The function of the prongs 106 is later described.

The top and bottom frames 24a and 28a (FIG. 2) are of identical design but used in flipped over relationship. The top lead frame 24a includes, at each device site Sn, a pair of interconnected bonding pads 62a and 64a. Similarly, the bottom lead frame sites each includes a pair of interconnected bonding pads 50a and 52a. Each pair 62a–64a and 50a–52a of bonding pads is connected to a respective lead 66a and 58a forming, in the completed device, a device terminal connection to the respective bonding pad pair. However, contrary to the cantilevered leads 66 and 58 (FIG. 1) according to the patent designed for connection to terminal leads of the middle frame 26, the leads 66a and 58a (FIG. 2) are not cantilevered, but are integrally connected to later to be discarded portions of the respective top 24a and bottom 28a lead frames. As in the patent, however, each lead 66a and 58a is bent out of the plane of its respective lead frame, and this is now described.

Figure 3:
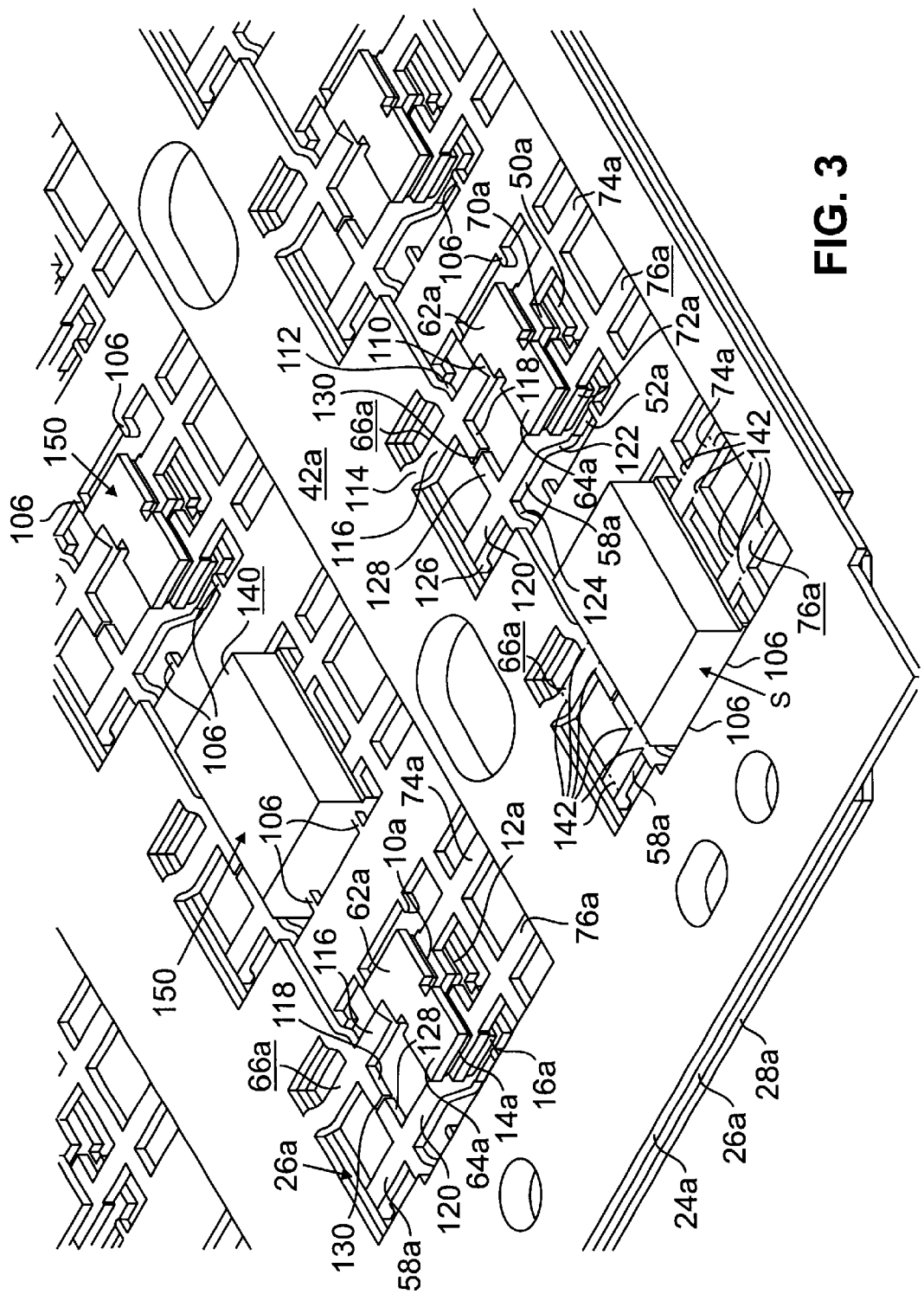
FIG. 3 is a view, in perspective, of a workpiece according to the invention for batch fabrication of semiconductor devices; the workpiece showing, at one stage of fabrication, the three frames shown in FIG. 2 in overlapped relationship and including, at each device site, four semiconductor chips; and the workpiece also including, at two of the sites, molded housings added to all the sites at a subsequent fabrication stage.

FIG. 2 indicates that the lead 66a of the top lead frame 24a has three bent portions 110, 112 and 114, and that the lead 58a has three bent portions 122, 124, and 126. Such bent portions, and the actual shapes of the leads 58a and 66a, are best shown in FIG. 3. FIG. 3 is a perspective view of a three lead frame workpiece formed when the three lead frames 24a, 26a and 28a shown in side by side relationship in FIG. 2 are stacked one on top of the other (similarly as in the patent and as hereinafter described). Included at each device site on the workpiece are four semiconductor chips 10a, 12a, 14a and 16a bonded between respective pairs of bonding pads. FIG. 3 also shows device housings 140 encapsulating central portions of two device sites. How such device housings are formed (simultaneously on all the device sites of the workpiece) is hereinafter described.

FIG. 3 shows one corner of the three lead frame workpiece and fully shows the portion of the top lead frame 24a at the corner. As shown, and similarly as shown in FIG. 2, the top lead frame 24a includes pairs of connected together bonding pads 62a and 64a joined to a cross bar 42a of the lead frame 24a by an extending lead 66a. As noted, the lead 66a is bent out of the plane of the top lead frame 24a at bent portions 110, 112 and 114 and includes a flat portion 116 lying in the plane of the middle frame 26a. (In FIG. 3, the bonding pads 70a and 72a of the middle lead frame 26a are shown respectively below the bonding pads 62a and 64a of the top lead frame 24a and above the bonding pads 50a and 52a of the bottom lead frame 28a.) The extent of the download displacement of the flat portion 116 of the lead 66a from the top frame 24a is such as to dispose the flat portion 116 in the plane of the middle frame bonding pads 70a and 72a and of the respective leads 74a and 76a extending therefrom. The only connection of the top frame bonding pads 62a and 64a to the remainder of the top frame 24a is by way of the extending lead 66a and, for greater mechanical strength, the flat portion 116 of the lead 66a is joined to the remainder of the lead frame 24a at two points, i.e., at the lead bent portions 112 and 114.

Extending laterally from the downwardly displaced, flat portion 116 of the lead 66a is a cantilevered bar 118 serving, as hereinafter described, as a dam bar during the device encapsulation process. The entire length of the dam bar 118 lies in the plane of the middle lead frame 26a. A length of the bent portion 112 also lies in the plane of the middle lead frame 26a and also functions as a dam bar, as later described.

As previously noted, the bottom lead frame 28a is identical to the upper lead frame 24a but in flipped over relationship therewith. In FIG. 3, the two bonding pads 50a and 52a of the bottom lead frame 28a are shown directly underlying the respective bonding pads 70a and 72a of the middle lead frame 26a with the lead 58a extending from the bonding pad 52a bent upwardly to include a flat portion 120 also lying in the plane of the middle frame 26a. As with the top lead frame 24a described, the lead 58a extending from the bottom frame bonding pad 52a includes three bent portions 122, 124 and 126 by means of which the lead flat portion 120 is integrally joined to the common portions of the lead frame 28a. A bar 128 extends from the lead flat portion 120 towards, and in the same plane as, the dam bar 118 from the top lead frame 24a. A gap 130 is shown in FIG. 3 between the facing ends of the two dam bars 118 and 128. Preferably, this gap is as small as possible consistent with manufacturing and assembling tolerances. To the extent possible, it is preferred that the two bars 118 and 128 actually engage one another and, as hereinafter described, means are used for later slightly deforming the two bars into contact with one another.

To the extent so far described, the significant differences between the lead frame workpiece according to the present invention and the lead frame workpiece according to the patent have been disclosed. One such difference is that, in the patent, the leads 66 and 58 (FIG. 1 herein) extending from the top and bottom frames are bent out of the planes of the top and bottom frames for soldered connection to the terminal leads 82 and 84 of the middle frame. Herein, as shown in FIG. 3, while the leads 66a and 58a from the top 24a and bottom 28a lead frames are bent to include flat portions 116 and 120 lying in the plane of the middle lead frame 26a, no soldered connections are made between the leads 66a and 58a and the middle lead frame 26a. Accordingly, and in comparison with the patent fabrication process, two solder joints are eliminated. As previously explained, and as self-evident, the reduction of the number of solder joints in each device improves the yield during manufacture and the reliability of the devices during use.

Another significant difference from the patent is that because, in the patent, the two leads 66 and 58 (FIG. 1) from the bonding pads of the top and bottom lead are cantilevered, i.e., have free ends not connected to common portions of the respective top 24 and bottom 28 lead frames, separate and additional connecting links 56 must be provided securing the bonding pads to the lead frames. As previously explained, these additional links are severed prior to device encapsulation. In accordance with the present invention, however, the two leads 66a and 58a extending from the bonding pads of the respective top and bottom lead frames are not cantilevered, but are integrally connected to respective common portions of the top and bottom lead frames. Additional links, similar to the links 56 in the patent, are not required, hence need not be severed prior to device encapsulation.

To emphasize this last point, in the patent, the two cantilevered leads 66 and 58 connect the bonding pads of the top and bottom lead frames to respective terminal leads 82 and 84 on the middle lead frame. During device encapsulation, and after the top and bottom lead frames have been stripped from the workpiece, only portions of the middle lead frame extend outwardly from the mold cavity through openings through the mold cavity walls. In the completed device, all four device terminals comprise lead portions severed from the middle lead frame.

In the present invention, however, the two leads 66a and 58a from the bonding pads of the top and bottom lead frames are bent to form flat portions 116 and 120 which lie in the plane of the middle lead frame. During device encapsulation, such flat portions 116 and 120, along with the leads 74a and 76a from the middle lead frame 26a, extend outwardly through openings in the mold cavity walls. In the completed device, two of the device terminals are the middle lead frame leads 74a and 76a, but the other two device terminals are the top and bottom lead frame leads 66a and 58a. The plastic molding process is shortly to be described.

The assembly of the three frame workpiece shown in FIG. 3 can be identical to the assembly process disclosed in the patent with the exception, as previously noted, that, in the inventive process, all the chips are initially placed on their respective bonding pads same side down. In the present illustrative embodiment, all the chips are disposed cathode side down. As in the patent, two, two-chip stacks of chips are thus formed at each device site.

Quite briefly, the fabrication process according to the present invention is as follows.

The three lead frames 24a, 26a, and 28a are made in known manner, e.g., by metal stamping and forming processes, and, as so fabricated, include the out-of-plane bent leads 66a and 58a of the top and bottom frames 24a and 28a. Conveniently, the middle 26a and bottom 28a lead frames are initially disposed in side by side relation, as shown in FIG. 2, on side-by-side tracks of an assembly machine, such as described in the patent, and simultaneously advanced past processing stations on the apparatus. At this initial processing, only the middle and bottom lead frames are present.

At a first station, solder, in the form of a tacky paste dot, is dispensed onto the top surface of each of the four bonding pads 50a, 52a, 70a and 72a of the two lead frames 28a and 26a. (Note that, in FIG. 2, each lead frame is shown with two component sites $S_1$ and $S_2$. The "four" bonding pads 50a, 52a, 70a and 72a referred to are the four bonding pads present in the middle 26a and bottom 26a lead frames of one device site to be formed when the three frames are stacked together. Also, as previously explained, each lead frame includes device sites arrayed in rows and columns. Conveniently, at each processing station, all the sites along one column of each of the two lead frames 28a and 26a are simultaneously processed. Successive columns of sites are processed as the two lead frames are simultaneously indexed past each processing station.)

At a second station, a respective semiconductor chip is placed (cathode side down) on the tacky paste dots on each of the bonding pads of the two lead frames 28a and 26a.

At a third station, both lead frames are heated for increasing the tackiness of the solder dots for more firmly adhering the chips to the bonding pads.

At a fourth station, further tacky dots (either solder paste or, presently preferred, simply dots of solder flux) are placed on the upper (anode) sides of the chips.

At a fifth station, the middle lead frame 26a is picked up, precisely aligned with, and placed on the bottom lead frame 28a. In such stacking process, the bottom surface of each bonding pad 70a and 72a on (each site of) the middle lead frame 26a contacts and rests on the solder bearing surface of a chip mounted on a respective bonding pad 50a and 52a of the bottom lead frame 28a.

At a sixth station, the top lead frame 24a is picked up, precisely aligned with, and placed on the middle lead frame 26a (lying on the bottom lead frame 28a). The bottom surface of each bonding pad 62a and 64a of the top lead frame contacts and rests on the solder bearing surface of a chip mounted on a respective bonding pad 70a and 72a of the middle lead frame 26a.

Precise alignment of the three lead frames relative to one another can be achieved by known means, e.g., the use of alignment pins passing through alignment openings through each of the lead frames.

A three-lead frame workpiece such as shown in FIG. 3 has now been formed which is then heated. This causes softening and reflow of all the solder pastes between contacting surfaces of the chips and bonding pads for forming, after cooling, permanent solder joints at the contacting surfaces. For each device being fabricated on the workpiece, eight solder joints are formed for the eight surfaces of the four chips bonded in place between respective pairs of bonding pads.

The next step is to plastic encapsulate a "central portion" 150 of each device on the workpiece, such central portion 150 comprising the four semiconductor chips, the respective bonding pad pairs bonded to each chip, and portions of the four terminal leads extending from respective bonding pads. While a generally known encapsulation process is used, using known types of molds and plastic encapsulation material, an important aspect of the present invention is how the devices are designed for compatibility with such known encapsulation processes.

Figure 4:
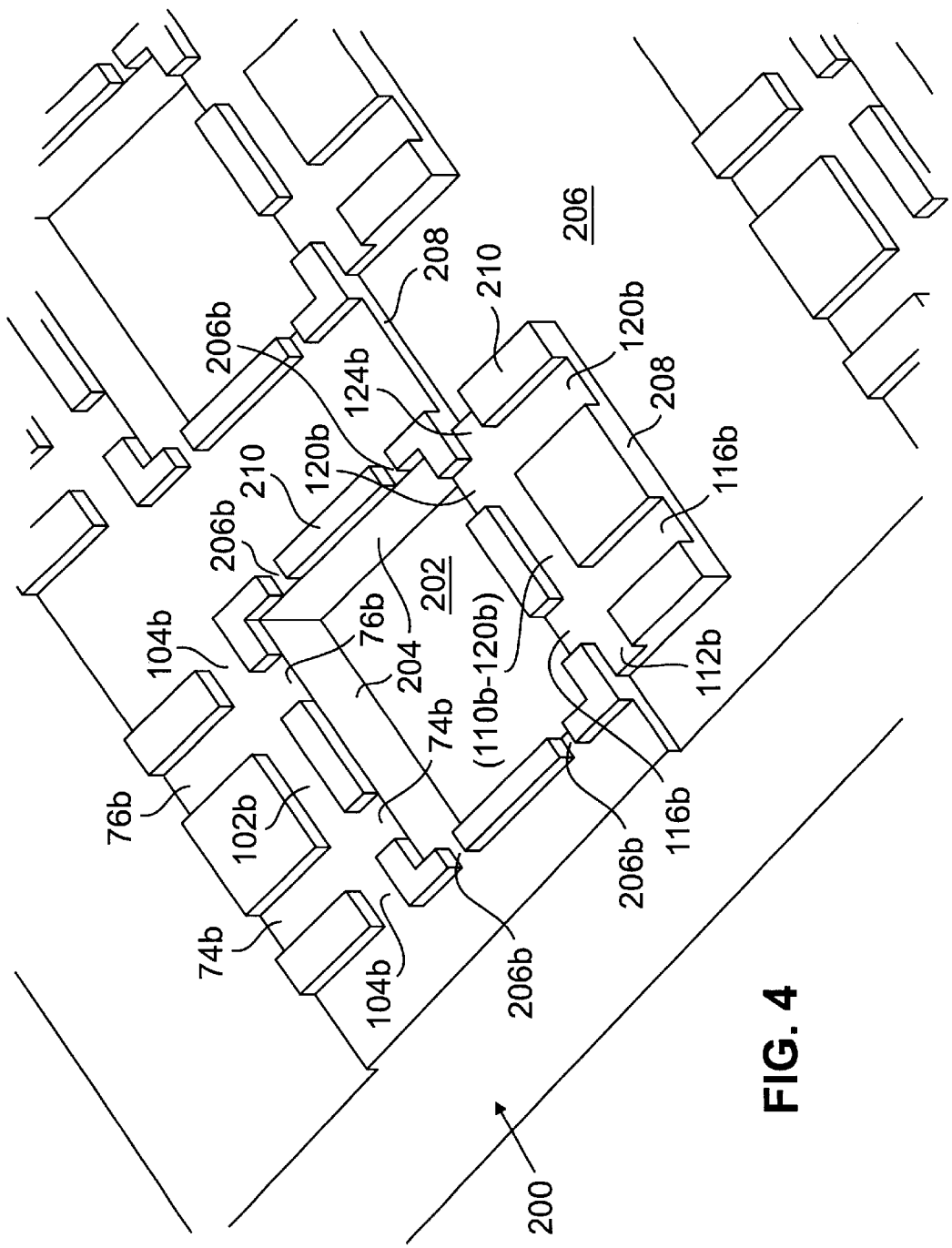
FIG. 4 is a view, in perspective, of a portion of a mold half used for plastic encapsulating each device being made on the three-lead frame workpiece shown in FIG. 3.

In accordance with known encapsulation procedures, two mold halves are used including a lower mold half 200; a portion of which is shown in FIG. 4. An upper mold half, not shown, is complementary to the half partially shown and, in use, is placed directly over and clamped to the mold half 200. The clamped together composite mold forms an array of mold sites corresponding to the array of device sites on the three-lead frame workpiece. In FIG. 4, one mold site on the lower mold half is fully shown, with two adjacent cavities only partially illustrated.

Each mold site in the lower mold half includes a cavity 202 defined by side walls 204 extending downwardly from an upper surface 206 of the mold half 200. Disposed around the cavity 202 are platforms 208 of equal height on which are disposed a number of raised blocks 210 defining grooves for receipt of portions of each device which are not to be encapsulated. The blocks are of equal heights, and the grooves are of equal depths.

While the fitting of the three-lead frame workpiece shown in FIG. 3 on the mold portion shown in FIG. 4 is not illustrated, the fit of each workpiece device site within each mold site is readily visualized. Thus, the workpiece shown in FIG. 3 is simply placed on top of the mold half 200 shown in FIG. 4 with the four-chip central portion 150 of each workpiece device centered within a mold cavity 202 and with the various leads extending from each such device central portion snugly resting within respective grooves surrounding the cavity 202. The upper surfaces of the platforms 208 (comprising the bottom surfaces of the various grooves defined by the raised blocks 210) lie in a common plane. Such common plane conforms to the plane of the bottom surface of the middle lead frame 26a shown in FIG. 3.

When the central portion 150 of the device shown in FIG. 3 is disposed within the cavity 202 of the mold half 200 shown in FIG. 4, the two middle frame device leads 74a and 76a (and accompanying dam bars 102 and 104) lie in respective mold grooves 74b, 76b, 102b and 104b. Similarly, the flat portions 116 and 120 of the leads 66a and 58a from the top 24a and bottom 28a lead frames lie snugly within respective mold grooves 116b and 120b. The two dam bars 118 and 126 extending (FIG. 3) from and coplanar with the two lead flat portions 116 and 120 face towards one another in the mold groove 118b–126b.

As mentioned, the plastic encapsulation top mold half is complementary to the bottom mold half 200 and includes, in addition to cavities complementary to the cavities 202 in the lower mold half, a relief pattern providing surfaces facing towards the lower mold half for engaging the upwardly facing surfaces of the various blocks 210 of the lower mold as well as upwardly facing surfaces of those portions of the device leads disposed within the aforementioned grooves defined by the blocks 210.

The depths of the grooves defined by the blocks 210 in the lower mold half are precisely equal to the thickness of the respective lead portions contained therewithin, hence the top surfaces of the lead portions within the grooves are coplanar with the top surfaces of the blocks. When the two mold halves are clamped together, those portions of the three-lead frame leads lying within the grooves are clamped between the groove bottom surfaces and overlying and contacting surfaces of the top mold half. The manufacturing tolerances associated with the thickness of the lead frame leads and the heights of the mold blocks and platforms are such that the clamped relationship of the lead upper and lower surfaces with the mold contacting surfaces is sufficiently snug to prevent the plastic encapsulating material injected into the mold cavities from leaking out the cavities along the top and bottom surfaces of the leads.

Owing to manufacturing tolerances, it is difficult to achieve a similarly snug fit between the sides of the leads and the side walls of the grooves. For minimizing leakage of the injected plastic material along the sides of the leads, the various dam bars (FIG. 3) 102, 104, 112, 118, 126 and 128 are used. In accordance with known practice, the dam bars force leaking encapsulating material to flow laterally away from the leads and along transverse extensions of the leads which are later discarded. Thus, while leakage of the plastic material does occur, the material does not extend along the device terminals where it would, if present, interfere with later electrical contacting to the device terminals.

While not discussed in the patent, a feature thereof is that each of the device terminal leads 74, 76, 82 and 84 (FIG. 1 herein) is readily provided with a laterally extending dam bar lying in the plane of the middle frame 26. In the present invention, the leads 74a and 76a of middle lead frame 26a (FIG. 4) are likewise provided with laterally extending dam bars 102 and 104.

A feature of the present invention is that a composite dam bar is formed from the respective dam bar extensions 118 and 128 from the two leads 66a and 58a from the spaced apart top 24a and bottom 28a lead frames. Such composite dam bar is feasible because the two dam bar extensions 118 and 126 are formed to lie in a common plane in the assembled together three-lead frame workpiece.

As shown in FIG. 3, owing to manufacturing tolerances and the need to separately fabricate and then later assemble together the various lead frames of the workpiece, some tiny gap 130 inevitably initially exists between the ends of the two dam bar extensions 118 and 128. This gap 130 is preferably eliminated or at least reduced in size by the known technique of the use of pairs of tiny inclined spikes dependent from the upper mold half. When the top mold half is placed on and clamped against the bottom mold half 200, each spike engages a respective dam bar extension upper surface for slightly deforming and stretching the two extensions towards one another.

After device encapsulation, all the devices on the lead frame workpiece are encapsulated in an individual solid, molded plastic envelope 140 such as shown in FIG. 3. (As previously noted, for ease of visualization, the workpiece shown in FIG. 3 shows only some of the device sites encapsulated. In actuality, when the FIG. 3 workpiece is first formed, none of the device sites is encapsulated. During encapsulation, all of the sites are simultaneously encapsulated. FIG. 3 thus shows device sites at two different stages of fabrication, and the workpiece shown in FIG. 3 never exists as shown.

From FIG. 3, it is evident that the housing 140 encloses the central portion 150 of each device as well as the respective bent portions 110 and 122 of the top 24a and bottom 26a lead frame leads 66a and 58a. Clearly, when the three-lead frame workpiece of FIG. 3 is disposed on the lower mold half-shown in FIG. 4, the lead bent portions 110 and 122 are disposed wholly within the cavity 202 and slightly spaced from the cavity facing ends of the grooves 116b and 120b. Likewise, the central portion 150 of each device is centered within the cavity 202 and in spaced apart relation with the cavity walls 204.

The middle lead frame 26a includes, as shown in FIGS. 2 and 3, the previously mentioned four prongs 106. Such prongs extend into the mold cavity 202 (FIG. 4) through grooves 206b defined by mold blocks 210. As shown in FIG. 3, the leading ends of the prongs 106 penetrate into the walls of the device housing 140. The purpose of the partially encapsulated prongs (in accordance with known processing techniques) is described hereinafter.

After device encapsulation the next step, in accordance with known technology, is to sever all the leads 58a, 66a, 74a and 76a from the remaining, unencapsulated portions of the respective lead frames. Significantly, in comparison with the patent process, only a single lead severing process is performed, and at a time when the chips are fully encapsulated and protected within the solid, molded housing 140. The various leads are cut along dotted lines 142 shown at the device site marked S in FIG. 3.

Figure 5:
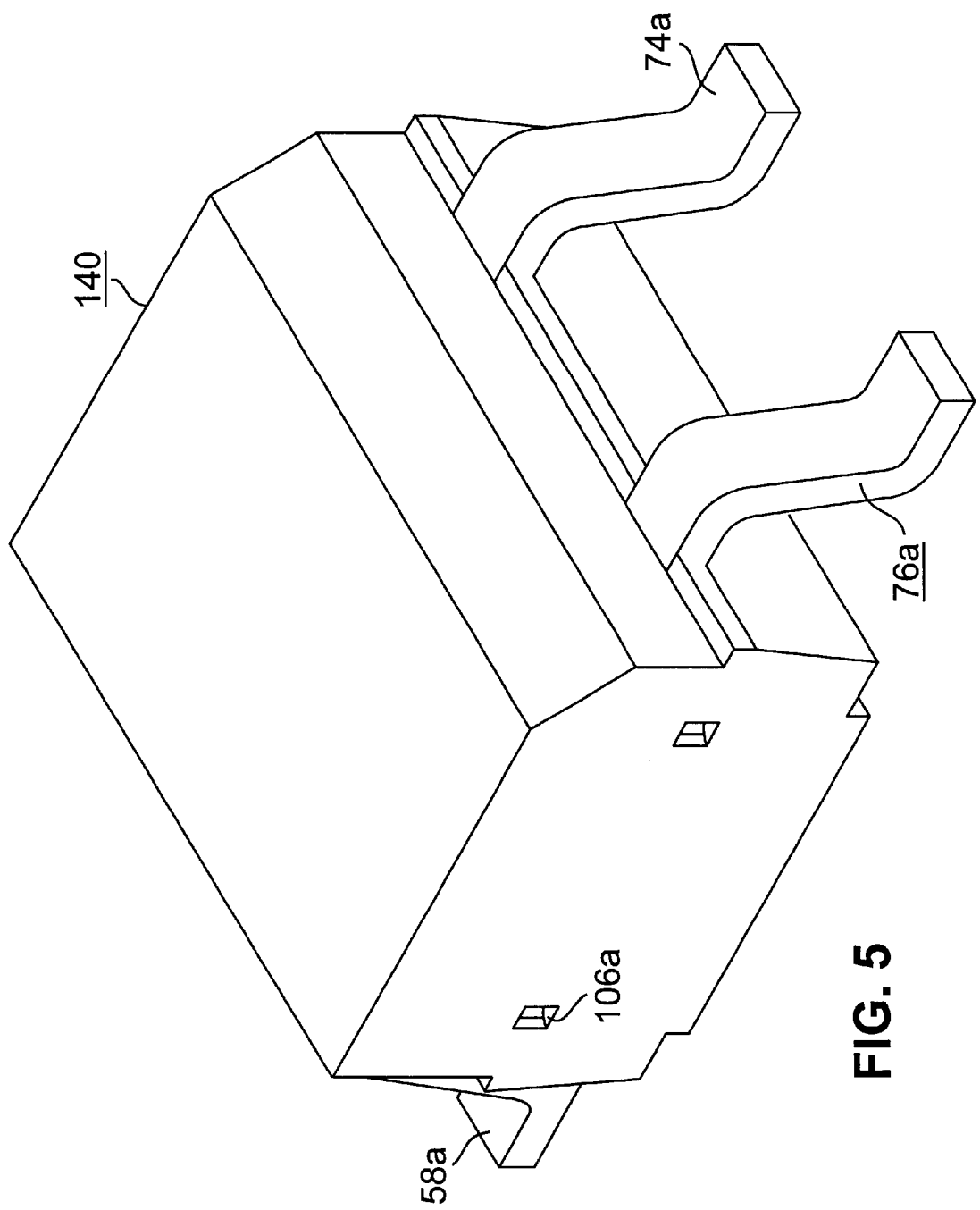
FIG. 5 is a view, in perspective, of one of the housed devices shown in FIG. 3 removed from the workpiece and further processed to include shaped terminal leads.

Although not illustrated, when all four terminal leads 58a, 66a, 74a and 76a extending from each device housing are severed (along the dotted lines 142), each device remains secured to the lead frame workpiece only by means of the four prongs 106 from the middle lead frame 26a extending a short distance into the solid wall of the device housing 140. By so retaining all the devices secured to the lead frame workpiece, further known processes are then simultaneously performed on all the devices for shaping the device terminals, e.g., to the shapes shown in FIG. 5.

Finally, by applying a downward force against the housing of each device relative to the lead frame workpiece, the devices are stripped off the prongs 106 leaving small and insignificant depressions (FIG. 5) in the device solid housing walls. Typically, the separated devices are thereafter individually tested in known manner.

Figure 6:
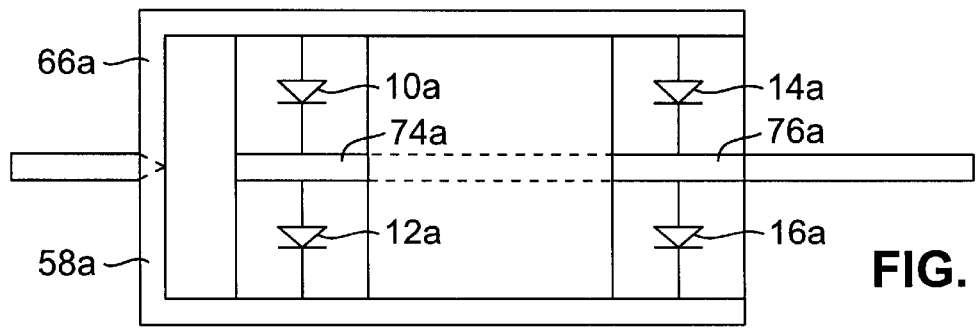
FIG. 6 is a schematic side elevation showing the electrical interconnections and terminal leads of a bridge rectifier made according to the invention.

Each completed device comprises two, two-chip stacks of semiconductor chips which are electrically interconnected, as shown in FIG. 6, to form a two-phase bridge rectifier having four accessible terminal leads 58a, 66a, 74a and 76a. In use of the bridge rectifier, an electrical load is connected between the terminals 58a and 66a and an a.c. electrical source is applied between the terminals 74a and 76a. With the chips oriented as indicated, cathode side down, the terminal 58a is always positive relative to the terminal 66a for either polarity of the a.c. source. If the chips are all mounted anode side down, the terminal 58a is always negative relative to the terminal 66a.

While not forming part of the present invention, as being generally known, a description is provided of two means (illustrated in FIGS. 7 and 8) for electrically interconnecting lead frame bonding pads to chip electrodes.

Figure 7:
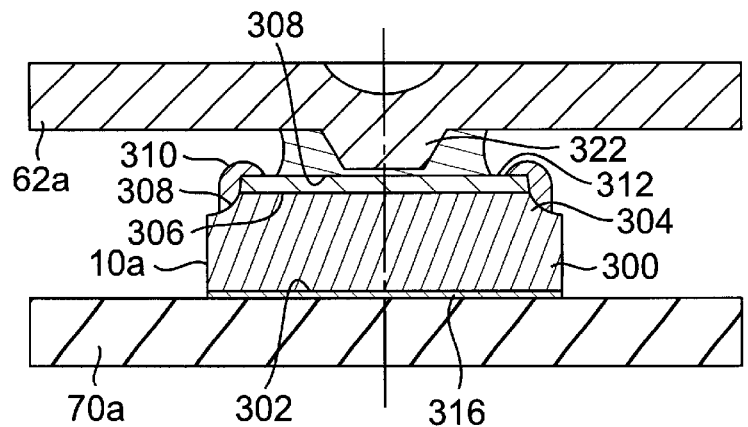
FIGS. 7 and 8 are side sectional views showing two known techniques for mounting one of the chips shown in FIG. 3 between a pair of lead frame bonding pads.
Figure 8:
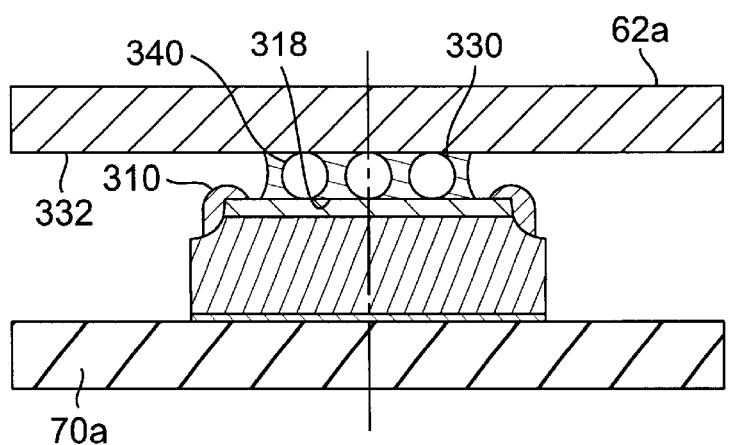

In the present illustrative embodiment, the four rectifier chips 10a, 12a, 14a and 16a used in each device are identical, and one such chip, e.g., the chip 10a, of generally known design, is shown in both FIGS. 7 and 8.

The chip 10a is of the mesa type including a square substrate 300 having a flat bottom surface 302 and an upwardly extending mesa 304. A p-n junction 306, of generally planar configuration, is disposed within the mesa 304 and intercepts the side wall 308 of the mesa. For protecting the mesa p-n wall intercept, a passivating layer 310, e.g., of glass, is provided on the mesa side wall and extends onto a top surface 312 of the mesa.

In this embodiment, the chip substrate 300 is of N type silicon, and an upper layer of the mesa is doped P type. The substrate 300 is thus the diode cathode, and the mesa upper part is the diode anode. A flat metal cathode electrode 316 contacts the entire bottom surface 302 of the substrate 300. A flat, circular metal anode 318 electrode contacts only a central portion of the mesa upper surface 312 and is spaced from the glass passivating layer 310 on the mesa top surface 312. Electrical connections are provided between the two device electrodes 316 and 318 and respective lead frame bonding pads 62a and 70a, usually by means of soldering.

The cathode electrode 316 completely covers the bottom surface 302 of the substrate, hence the bonding pad 70a connected to the cathode electrode 316 is similarly flat.

The anode electrode 318, however, is spaced from the surrounding passivating layer 310 and must not be in electrical contact with the passivating layer 310. To this end, in the presently preferred embodiment of the invention shown in FIG. 7, the bonding pad 62a is provided with a downwardly extending dimple 322 which extends centrally through the annular passivating layer 310 without contact with the layer 310 and into contact with the anode electrode 318. The dimple (in all anode contacting bonding pads) is provided by known metal forming, e.g., punching, processes.

In the embodiment shown in FIG. 8 (the presently preferred process), the top bonding pad 62a is not provided with a dimple but is completely flat as is the bottom bonding pad 70a. Here, to ensure that the solder joint 330 bonding the bonding pad 62a to the anode electrode 318 is sufficiently thick to provide space between the bottom surface 332 of the bonding pad 62a and the passivating layer 310, rigid spacer balls 340, preferably of copper, are embedded within the solder paste applied to the chip to electrode 318 during fabrication of the three-lead frames workpiece (previously described). At least some of the rigid spacer balls 340 have diameters not less than the desired minimum thickness of the resulting solder joint 330 and, with such spacer balls 340 in place as shown in FIG. 8, contact between the bonding pad 62a bottom surface 332 and the passivating layer 310 is prevented.

What is claimed is:

1. A method of fabricating a semiconductor device comprising the steps of:

securing a first, bottom surface of a semiconductor diode first chip on a top surface of a first bonding pad integrally attached to a generally flat lead frame lying on a first plane by a looped first lead including a first length portion lying in a second plane spaced above said first plane, and securing a second, top surface of said chip to a bottom surface of a second bonding pad integrally attached to a generally flat second lead frame lying in said second plane by a flat second lead, and encapsulating said chip, said first and second bonding pads and portions of said first and second leads integral respectively to said first and second lead frame extended outwardly from said housing, wherein said encapsulating step comprises disposing said chip within a mold cavity with said first length portion of said first lead and said second lead extending from within said cavity, for being encapsulated, to outside said cavity through openings through a wall defining said cavity for remaining unencapsulated.

2. A method according to claim 1 including the steps of providing each of said first and second leads with laterally extending dam bar, and said disposing step includes disposing said dam bar closely adjacent to outside surfaces of said cavity defining wall and extending closely parallel to said surfaces for at least partially blocking escape of encapsulating material injected into said cavity outwardly through said cavity and lead extending openings.

3. A method according to claim 2 including the steps of disposing within said cavity: (a) a second semiconductor diode chip; (b) third and fourth bonding pads between which second chip is secured, and (c) a portion each of a third, looped lead integrally attaching said third bonding pad to a third, generally flat lead frame lying in a third plane spaced below said first plane and a fourth lead integrally attaching said fourth bonding pad to said second lead frame, and with a second length portion of said third lead and a portion of said fourth lead extending outwardly from said cavity through openings through said wall.

4. A method according to claim 3 including the step of disposing a dam bar laterally extending from said third lead in closely spaced, colinear and coplanar relationship with said dam bar from said first lead for forming a composite, unitary dam bar.

5. A method according to claim 4 including the step of severing said first, second, third and fourth leads from the remaining unencapsulated portions of the respective lead frames, wherein said severing step is the only severing step performed in the method of fabricating a semiconductor device and wherein said severing step is performed after device encapsulation.

* * * * *